United States Patent [19]

Coddington

[11] Patent Number: 5,008,570
[45] Date of Patent: Apr. 16, 1991

[54] SCHMITT-TRIGGERED TTL TO CML INPUT BUFFER APPARATUS

[75] Inventor: John D. Coddington, Plymouth, Minn.

[73] Assignee: The United States of America as represented by the Secretary of the Air Force, Washington, D.C.

[21] Appl. No.: 502,397

[22] Filed: Mar. 30, 1990

[51] Int. Cl.⁵ .................... H03K 17/16; H03K 3/354
[52] U.S. Cl. .................... 307/475; 307/290; 307/443; 307/455
[58] Field of Search ............... 307/475, 290, 455, 443

[56] References Cited

U.S. PATENT DOCUMENTS

| | | | |
|---|---|---|---|
| 4,607,177 | 8/1986 | Lechner | 307/475 |
| 4,612,460 | 9/1986 | Gloaguen et al. | 307/475 |
| 4,719,367 | 1/1988 | Denda | 307/290 |
| 4,737,663 | 4/1988 | Varadarajan | 307/455 |
| 4,783,607 | 11/1988 | Hsieh | 307/475 |
| 4,806,800 | 2/1989 | Khan | 307/475 |
| 4,812,676 | 3/1989 | Yang et al. | 307/455 |
| 4,868,423 | 9/1989 | Abdi | 307/455 |

Primary Examiner—David Hudspeth
Assistant Examiner—Andrew Sanders
Attorney, Agent, or Firm—Jacob N. Erlich; Donald J. Singer

[57] ABSTRACT

A TTL to CML input buffer and conversion apparatus having a Schmitt trigger to receive a TTL logic signal and apply the logic signal levels to a CML gate unit. The logic levels of the TTL signal are converted by the CML gate unit into CML logic signals.

6 Claims, 1 Drawing Sheet

SCHMITT-TRIGGERED TTL TO CML INPUT BUFFER APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to an input buffer apparatus, and in particular to a Schmitt-triggered TTL to CML input buffer apparatus.

The state of the art of input buffer apparatus is well represented and alleviated to some degree by the prior art apparatus and approaches which are contained in the following U.S. Pat. Nos.:

U.S. Pat. No. 4,607,177 issued to Lechner on Aug. 19, 1986;

U.S. Pat. No. 4,719,369 issued to Denda on Jan. 12, 1988;

U.S. Pat. No. 4,737,663 issued to Varadarajan on Apr. 12, 1988;

U.S. Pat. No. 4,783,607 issued to Hsieh on Nov. 8, 1988; and

U.S. Pat. No. 4,806,800 issued to Khan on Feb. 21, 1989.

The Lechner patent describes a circuit arrangement for level conversion of TTL-logic levels to ECL-logic levels with at least one emitter-coupled current switch having an input addressable by TTL-logic levels and an output from which ECL-logic levels can be taken off, including a first current switch formed of two emitter-coupled npn-transistors and a second current switch formed of two emitter-coupled pnp-transistors.

The Denda patent is directed to a B-MOS implementation of a Schmitt trigger circuit with an improved switching speed.

The Varadarajan patent discloses a current source arrangement for three-level emitter-coupled logic and four-level current mode logic which utilizes a low drop current source that is incorporated in the series-gated arrangement.

The Hsieh patent discusses a TTL/CMOS compatible input buffer circuit which utilizes a Schmitt trigger input buffer stage and a reference voltage generator. In the TTL mode, the reference voltage generator supplies a reference voltage having a level that forces the trigger point of the Schmitt trigger to a predetermined value. In the CMOS mode, the reference voltage generator is disabled and a voltage equal to the power supply voltage is provided to the Schmitt trigger.

The Khan patent describes a high speed low power electrical circuit for converting true TTL level signals to true ECL level signals. The circuit only has a single buffer delay with some small additional delay due to an input emitter follower stage.

While the above-cited prior art patents are instructive, it is clear that a need remains to provide a TTL to CML input buffer apparatus which solves the shortcomings of the prior art. The present invention is intended to satisfy that need.

SUMMARY OF THE INVENTION

The present invention utilizes a hysteresis circuit as the input to a current mode logic (CML) gate which generates its own reference level. The hysteresis circuit comprises a Schmitt trigger which utilizes a pair of Schottky transistors.

It is one object of the present invention therefore, to provide an improved Schmitt-triggered TTL to CML input buffer apparatus.

It is another object of the invention to provide an improved Schmitt-triggered TTL to CML input buffer apparatus wherein an hysteresis circuit is utilized as the input to the CML gate.

It is still another object of the invention to provide an improved Schmitt-triggered TTL to CML input buffer apparatus which utilizes a CML gate that generates its own reference level.

It is yet another object of the invention to provide an improved Schmitt-triggered TTL to CML input buffer apparatus wherein the hysteresis circuit is formed by a pair of Schottky transistors.

It is still another object of the invention to provide an improved Schmitt-triggered TTL to CML input buffer apparatus which receives a TTL level signal and converts it to a CML level signal as an output.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
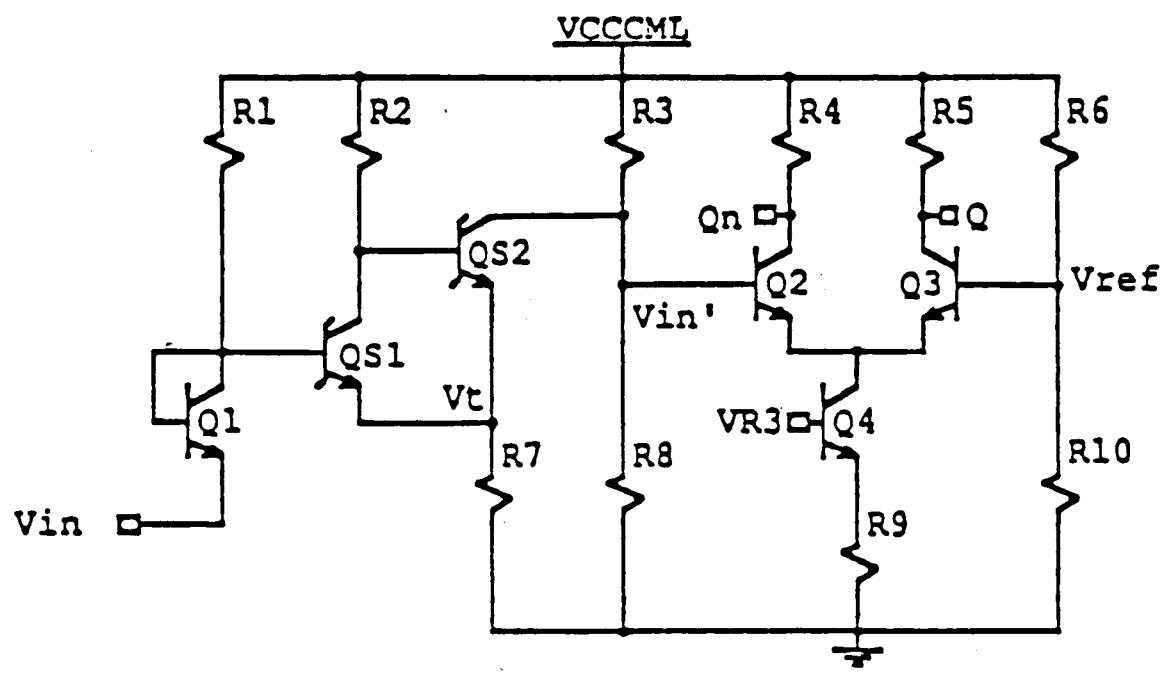
FIG. 1 is a schematic diagram of a Schmitt-triggered TTL to CML input buffer apparatus according to the present invention.

Referring now to FIG. 1, there is shown a schematic diagram of the Schmitt-triggered TTL to CML input buffer apparatus which receives a TTL signal, Vin at the emitter of input transistor, Q1. The collector of input transistor, Q1 is connected by resistor R1 to power supply VCC CML. The base of input transistor Q1 which is connected to the collector of input transistor Q1 is also connected to the base of Schottky transistor QS1. Schottky transistors QS1, QS2 comprise the hysteresis circuit which have their emitters connected to resistor R7. The collector of transistor QS1 is connected to the base of transistor QS2 and one side of resistor R2 which is connected to the power supply VCC CML. The CML gate which comprises transistors Q2, Q3 and Q4, receives an input signal at the base of transistor Q2 and a reference voltage, Vref is connected to the base of transistor Q3.

The invention, shown in FIG. 1, is a CML gate that generates its own reference level and has a hysteresis circuit on the input. The input signal to the circuit is Vin and the output signals are Q and Qn, Q being the non-inverting output and Qn being the inverting output.

The internally generated reference voltage, Vref, is generated by a simple resistor divider network which is formed by resistors R6 and R10. The buffered input signal Vin' which is applied to the CML gate input is compared to the reference voltage, Vref. When no current is being pulled through resistor R3 by the hysteresis circuit, Vin' is simply a resistor divider network which comprises resistors R3 and R8. Resistors R3 and R8 are ratioed such that Vin' is higher than Vref.

The Schottky transistors QS1 and QS2 in conjunction with resistors R7 and R2 form the hysteresis circuit. When the input signal Vin is low, transistor QS1 is off and transistor QS2 is on. When transistor QS2 is on, it causes extra current to be pulled through resistor R3, thus causing the voltage Vin' to be lower than Vref, and therefore node Q is pulled low and transmits a CML logic zero. Resistor R7 is chosen such that the voltage Vt is at the threshhold voltage for the input that is desired to turn transistor QS1 on. This threshold voltage is around 1.8 volts.

When input signal Vin is high, transistor QS1 is on and transistor QS2 is off. Transistor QS2 is no longer pulling extra current through resistor R3, so voltage Vin' is higher than the voltage Vref, therefore node Q rises to the supply voltage, VCC CML and transmits a CML logic one. The ratio of resistor R2 to resistor R7 is set such that voltage Vt is at the voltage desired for input signal Vin to be at to turn transistor QS1 off. This threshold voltage is around 0.8 volts.

The hysteresis effect is achieved by making sure that when input signal Vin is high, the voltage at Vt, which determines the trigger point, is lower than it is when input signal Vin is low.

Although the invention has been described with reference to a particular embodiment, it will be understood by those skilled in the art that the invention is capable of a variety of alternative embodiments within the spirit and scope of the appended claims.

What is claimed is:

1. An input buffer apparatus comprising in combination:

a CML gate having a first and second input, said first input receiving a voltage reference signal, said CML gate providing a first and second output signal, which are respectively complementary, and, a hysteresis means operatively connected to said first input of said CML gate, said hysteresis means receiving a logic signal at its input, when said logic signal is low, said hysteresis means applies a trigger signal to said second input of said CML gate which is lower than said voltage reference signal and thus causes said first output signal to become a logical zero, when said logic signal is high, said hysteresis means applies a trigger signal to said second input of said CML gate which is higher than said voltage reference signal and thus causes said first signal to become a logical one, said hysteresis means comprises a Schmitt trigger.

2. An input buffer apparatus as described in claim 1 wherein said CML gate means comprises a differential amplifier unit.

3. An input buffer apparatus as described in claim 1 wherein said voltage reference signal is internally generated by said CML gate.

4. An input buffer apparatus as described in claim 1 wherein said first output signal varies between a CML logical one or zero in direct correspondence with the logic state of said logic signal.

5. An input buffer apparatus as described in claim 1 wherein said Schmitt trigger comprises a pair of Schottky transistors.

6. An input buffer apparatus as described in claim 3 wherein said CML gate utilizes a resistance divider network to generate said voltage reference signal.

* * * * *